(12) United States Patent
Dix et al.

(10) Patent No.: US 9,972,578 B2
(45) Date of Patent: May 15, 2018

(54) STACKED DIE GROUND SHIELD

(71) Applicant: Microchip Technology Incorporated, Chandler, AZ (US)

(72) Inventors: Gregory Dix, Tempe, AZ (US); Lee Furey, Phoenix, AZ (US); Rohan Raghunathan, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days. days.

(21) Appl. No.: 15/471,889

(22) Filed: Mar. 28, 2017

(65) Prior Publication Data

US 2017/0287850 A1  Oct. 5, 2017

Related U.S. Application Data

(60) Provisional application No. 62/314,875, filed on Mar. 29, 2016.

(51) Int. Cl.
| | |
|---|---|
| *H01L 23/00* | (2006.01) |
| *H01L 23/552* | (2006.01) |
| *H01L 25/065* | (2006.01) |
| *H01L 23/31* | (2006.01) |
| *H01L 23/495* | (2006.01) |

(52) U.S. Cl.
CPC ........ *H01L 23/552* (2013.01); *H01L 23/3171* (2013.01); *H01L 23/49575* (2013.01); *H01L 24/16* (2013.01); *H01L 24/29* (2013.01); *H01L 24/32* (2013.01); *H01L 24/73* (2013.01); *H01L 25/0657* (2013.01); *H01L 2224/16245* (2013.01); *H01L 2224/2919* (2013.01); *H01L 2224/32245* (2013.01); *H01L 2224/48245* (2013.01); *H01L 2224/73265* (2013.01); *H01L 2225/0651* (2013.01); *H01L 2225/06517* (2013.01)

(58) Field of Classification Search
CPC ..................................................... H01L 23/552
See application file for complete search history.

(56) References Cited

U.S. PATENT DOCUMENTS

| | | | |
|---|---|---|---|
| 6,437,449 B1 * | 8/2002 | Foster ............... | H01L 23/49575 257/676 |
| 2002/0135057 A1 * | 9/2002 | Kurita ................. | H01L 25/0657 257/685 |
| 2004/0051170 A1 | 3/2004 | Kawakami et al. .......... 257/686 |

(Continued)

OTHER PUBLICATIONS

International Search Report and Written Opinion, Application No. PCT/US2017/024764, 12 pages, dated Jun. 29, 2017.

*Primary Examiner* — William Harriston
(74) *Attorney, Agent, or Firm* — Slayden Grubert Beard PLLC

(57) ABSTRACT

The present disclosure relates to semiconductor devices. Embodiments of the teachings thereof may include processes for manufacturing of semiconductor devices and the devices themselves. For example, some embodiments may include an integrated circuit package comprising: a lead frame; a first die mounted on the lead frame in flip-chip fashion, with a frontside of the first die connected to the lead frame; wherein the first die comprises an oxide layer deposited on a backside of the first die and a back metal layer deposited on the oxide layer; and a second die mounted on the back metal layer of the first die.

15 Claims, 2 Drawing Sheets

(56) References Cited

U.S. PATENT DOCUMENTS

2004/0195591 A1* 10/2004 Gehman ............. H01L 25/0657
 257/202
2011/0042798 A1 2/2011 Pagaila et al. ................ 257/692

* cited by examiner

STACKED DIE GROUND SHIELD

RELATED PATENT APPLICATION

This application claims priority to U.S. Provisional Patent Application No. 62/314,875 filed Mar. 29, 2016; which is hereby incorporated by reference herein for all purposes.

TECHNICAL FIELD

The present disclosure relates to semiconductor devices. Embodiments of the teachings thereof may include processes for manufacturing of semiconductor devices and the devices themselves.

BACKGROUND

Discrete power transistors or power transistors on separate dies may be arranged within a single integrated device comprising more than one chip. One common method for arranging multiple chips in a single device includes stacking the chips or dies upon each other. In some devices, a first chip may include a power transistor and the other chip may include a microcontroller. A controller or any other device that is used in such a stacked arrangement may be sensitive to noise produced by the other chip.

SUMMARY

According to various embodiments, depositing a layer of oxide & metal on the back of the wafer may create a voltage shield to keep noise out of the controller die. The isolated voltage shield can be bonded to a fixed voltage creating a shield from noise. For example, some embodiments may include an integrated circuit package comprising: a lead frame; a first die mounted on the lead frame in flip-chip fashion, with a frontside of the first die connected to the lead frame; wherein the first die comprises an oxide layer deposited on a backside of the first die and a back metal layer deposited on the oxide layer; and a second die mounted on the back metal layer of the first die.

In some embodiments, the second die is mounted on the back metal layer with an adhesive.

In some embodiments, the second die is mounted on the back metal layer with a non conductive epoxy.

Some embodiments may include bumps connecting the first die to the lead frame.

In some embodiments, the back metal layer may be wire bonded to a finger of the lead frame.

In some embodiments, the first die comprises a power semiconductor.

In some embodiments, the second die comprises a controller.

In some embodiments, the second die comprises a circuit sensitive to noise.

In some embodiments, the first die comprises a power semiconductor; and the second die comprises a controller.

Some embodiments may include circuits comprising: a lead frame; a first die mounted on the lead frame in flip-chip fashion, with the front of the first die connected to the lead frame; wherein the first die comprises an oxide layer deposited on the back of the first die and a back metal layer deposited on the oxide layer; a second die mounted on the back metal layer of the first die; the back metal layer wire bonded to a finger of the lead frame; and a voltage source providing a shielding voltage fed to the back metal layer through the finger.

Some embodiments may include a method for manufacturing a semiconductor device, comprising: manufacturing a first semiconductor die comprising at least one semiconductor device; depositing an oxide layer on a back side of the die; and depositing a back metal layer on top of the oxide layer.

Some embodiments may include mounting the first die on a lead frame in flip-chip fashion; mounting a second die on top of the first die using an adhesive; wire bonding the back metal layer with one of a plurality of lead frame fingers; and wire bonding the second die with a different one of the plurality of lead frame fingers.

Some embodiments may include encapsulating the semiconductor device.

Some embodiments may include methods of operating an integrated circuit package including a lead frame, a first die mounted on the lead frame in flip-chip fashion, with the front of the first die connected to the lead frame, wherein the first die comprises an oxide layer deposited on the back of the first die and a back metal layer deposited on the oxide layer, a second die mounted on the back metal layer of the first die, the back metal layer wire bonded to a finger of the lead frame, and a voltage source providing a shielding voltage fed to the back metal layer through the finger. The methods may include: generating a shielding voltage; feeding the shielding voltage to said finger of the lead frame; and operating a circuit and devices within the first and second dies.

Some embodiments may include a controller in the second die controlling at least one power transistor in the first die.

DETAILED DESCRIPTION

Teachings of the present disclosure may be embodied in methods for creating a ground shield for stacked die applications. The various embodiments may be employed to reduce noise in multi-chip modules where a "quiet" die is stacked on top of a Fet, or noisy die.

In some embodiments, the noisy die may include one or more extra layers. For example, at the end of fab processing, a layer of oxide may be deposited on the back of the wafer. Post fab, a layer of bondable metal may be deposited on top of the layer of oxide on the back side. The noisy (first) die may be flip-chip mounted to a lead frame, then a second die may be connected on top of the flipped die. The second die may be wire bonding to one or more connections of the lead frame and the bondable metal on the first die may be connected to a voltage source providing a shield potential.

Figure 1:
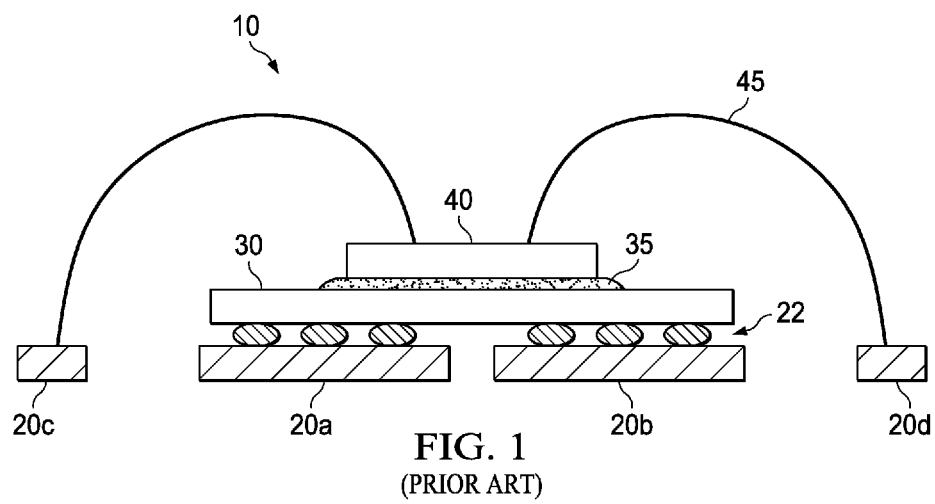
FIG. 1 is a schematic drawing that shows a prior art arrangement for packaging two chips in a single package.

FIG. 1 is a schematic drawing that shows a prior art arrangement for packaging two chips in a single package 10. As shown, a first die 30 may be flip-chip mounted to a lead frame 20. Flip chip mounting may also be referred to as controlled collapse chip connection (C4). In general, flip-chip mounting may be used to interconnect semiconductor devices such as IC chips 30 to external circuitry (e.g., a lead frame). When the IC chip 30 is manufactured, a set of solder bumps 22 are deposited on the top side of the IC chip 30 during the final wafer processing step. To mount IC chip 30 to the lead frame 20, IC chip 30 is 'flipped' upside down and aligned with pads 20a, 20b on the lead frame 20. The solder bumps 22 form the bond, e.g., after a solder reflow process.

As shown in FIG. 1, a second die 40 may be mounted on top of the first die 30. The second die 40 may be connected to one or more leads 20c, 20d of the lead frame 20, for example by wire bonding 45.

The first die 30 (or lower die) may include a power transistor and/or additional components that generate a relatively large amount of noise in the voltage (e.g., a field-effect transistor or FET). That voltage noise is, therefore, capacitively coupled to the second die 40 (or upper die).

Figure 2:
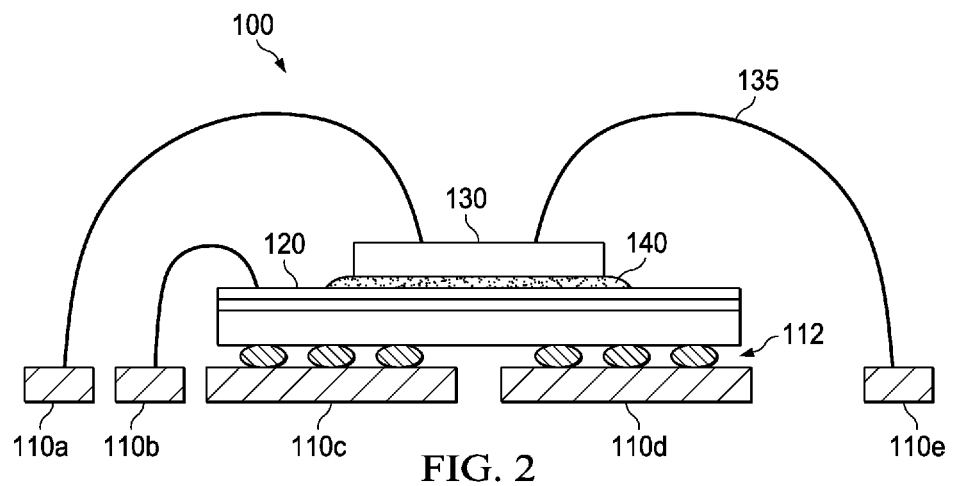
FIG. 2 is a schematic drawing that shows an example arrangement for packaging two chips in a single package, according to teachings of the present disclosure.

FIG. 2 is a schematic drawing that shows an example arrangement for packaging two chips in a single package 100, according to teachings of the present disclosure. In the example shown, package 100 may include lower die 120 and upper die 130. As with the package of FIG. 1, the upper die 130 may be stacked on top of the lower die 120.

The lower die 120 may include a so-called "noisy" component and/or die. In some examples, the lower die 120 may include switching power transistors, FETs, MOSFETs, and/or other dies with a noisy voltage signal. Once the various electrical components of lower die 120 have been manufactured (e.g., using various semiconductor manufacturing processes), various additional layers may be deposited on the back side of lower die 120 (discussed in more detail in relation to FIGS. 3 and 4). The lower die 120 is then flip-chip mounted to one or more pads 110c, 110d on a lead frame 110.

The upper die 130 may be stacked on top of the lower die 120. In some embodiments, a non-conductive adhesive 140 (e.g., an epoxy) may be used to connect the upper die 130 to the lower die 120. The various leads of the upper die 130 may be connected to leads 110a, 110e of the lead frame 110 using wire bonding 135. In some embodiments, a layer of metal on the back side of the lower die 120 may be connected to one or more pads 110b on the lead frame 110. This connection may be used to provide a shielding voltage to the metal layer and thereby shield the upper die 130, e.g., to eliminate the effect of voltage noise from the bottom die 120 on the top die 130. The shielding voltage may be connected through one of the pins of the leadframe 110. Thus, an external bias or shielding voltage can be applied through such a pin.

The various embodiments may provide for a low cost stacking arrangement with a greatly increased noise immunity. After the upper die 130 and the lower die 120 are stacked and connected (e.g., to the lead frame 110), the entire arrangement may be encapsulated and/or otherwise treated to provide an integrated circuit package.

Figure 3:
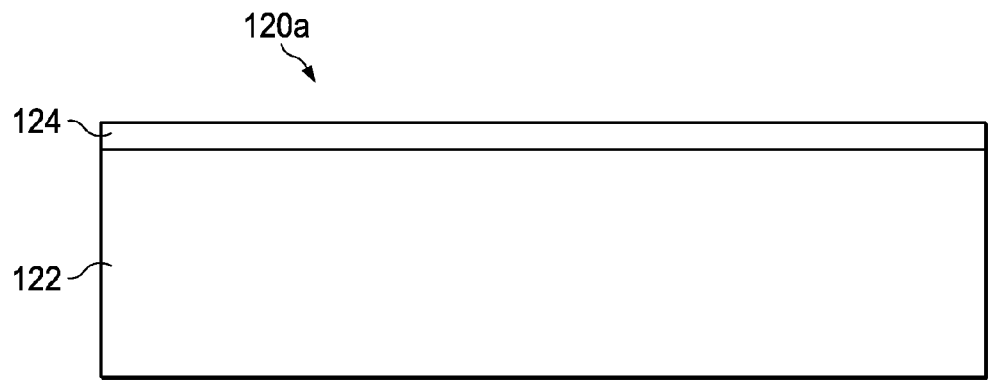
FIG. 3 is a schematic drawing showing a step in an example method for packaging two chips in a single package, according to teachings of the present disclosure.

FIG. 3 is a schematic drawing showing a step in an example method for packaging two chips in a single package, according to teachings of the present disclosure. As shown in FIG. 3, fabrication processes for the lower die 120a have been completed. At that completion, the lower die 120a includes a substrate or wafer 122. Typically, the circuitry and/or other features of the lower die 120a are processed on the front side of the wafer 122, at the bottom of FIG. 3.

As shown in FIG. 3, an oxide layer 124 is deposited on the back side of wafer 122 or the bottom die 120a. The oxide layer 124 may include various oxides known in the art of semiconductor fabrication.

Figure 4:
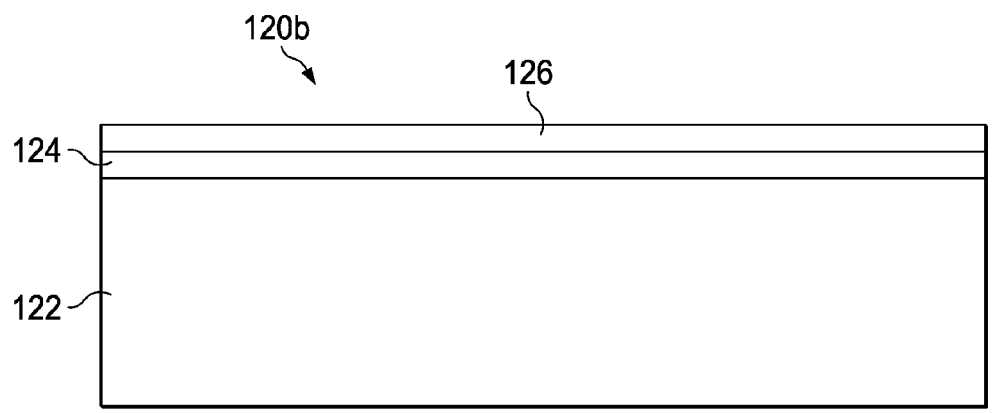
FIG. 4 is a schematic drawing showing a step in an example method for packaging two chips in a single package, according to teachings of the present disclosure.

FIG. 4 is a schematic drawing showing a step in an example method for packaging two chips in a single package, according to teachings of the present disclosure. After the oxide layer 124 is deposited as shown in FIG. 3, a metal layer 126 is deposited on top of the oxide layer 124. The metal layer 126 can then be connected to a shield potential to create the stacked arrangement shown in FIG. 2. The metal layer 126 may be bonded to a fixed voltage source and/or potential to protect the upper die 130 and/or any components thereon from the noisy voltage signal of the lower die 120b.

The invention claimed is:

1. An integrated circuit package comprising:
    a lead frame;
    a first die mounted on the lead frame in flip-chip fashion, with a frontside of the first die connected to the lead frame;
    wherein the first die comprises an oxide layer deposited on a backside of the first die and a back metal layer deposited on the oxide layer; and
    a second die mounted on the back metal layer of the first die;
    wherein the oxide layer and the back metal layer both cover a full extent of the backside of the first die and do not extend beyond edges of the first die.

2. The integrated circuit package according to claim 1, wherein the second die is mounted on the back metal layer with an adhesive.

3. The integrated circuit package according to claim 1, wherein the second die is mounted on the back metal layer with a non conductive epoxy.

4. The integrated circuit package according to claim 1, further comprising bumps connecting the first die to the lead frame.

5. The integrated circuit package according to claim 1, further comprising the back metal layer wire bonded to a finger of the lead frame.

6. The integrated circuit package according to claim 1, wherein the first die comprises a power semiconductor.

7. The integrated circuit package according to claim 1, wherein the second die comprises a controller.

8. The integrated circuit package according to claim 1, wherein the second die comprises a circuit sensitive to noise.

9. The integrated circuit package according to claim 1, wherein:
    the first die comprises a power semiconductor; and
    the second die comprises a controller.

10. A circuit comprising:
    a lead frame;
    a first die mounted on the lead frame in flip-chip fashion, with the front of the first die connected to the lead frame;
    wherein the first die comprises an oxide layer deposited on the back of the first die and a back metal layer deposited on the oxide layer;
    a second die mounted on the back metal layer of the first die;
    the back metal layer wire bonded to a finger of the lead frame; and
    a voltage source providing a shielding voltage fed to the back metal layer through the finger;

wherein the oxide layer and the back metal layer both cover a full extent of the backside of the first die and do not extend beyond edges of the first die.

11. A method for manufacturing a semiconductor device, comprising:
   manufacturing a first semiconductor die comprising at least one semiconductor device;
   depositing an oxide layer on a back side of the die; and
   depositing a back metal layer on top of the oxide layer;
   wherein the oxide layer and the back metal layer both cover a full extent of the backside of the first die and do not extend beyond edges of the first die.

12. The method according to claim 11, further comprising:
   mounting the first die on a lead frame in flip-chip fashion;
   mounting a second die on top of the first die using an adhesive;
   wire bonding the back metal layer with one of a plurality of lead frame fingers;
   wire bonding the second die with a different one of the plurality of lead frame fingers.

13. The method according to claim 11, further comprising encapsulating the semiconductor device.

14. A method of operating an integrated circuit package including a lead frame, a first die mounted on the lead frame in flip-chip fashion, with the front of the first die connected to the lead frame, wherein the first die comprises an oxide layer deposited on the back of the first die and a back metal layer deposited on the oxide layer, a second die mounted on the back metal layer of the first die, the back metal layer wire bonded to a finger of the lead frame, wherein the oxide layer and the back metal layer both cover a full extent of the backside of the first die and do not extend beyond edges of the first die and a voltage source providing a shielding voltage fed to the back metal layer through the finger, the method comprising:
   generating a shielding voltage;
   feeding the shielding voltage to said finger of the lead frame; and
   operating a circuit and devices within the first and second dies.

15. The method according to claim 14, further comprising a controller in the second die controlling at least one power transistor in the first die.

* * * * *